US009647044B2

(12) United States Patent
Ma et al.

(10) Patent No.: US 9,647,044 B2
(45) Date of Patent: May 9, 2017

(54) ORGANIC LIGHT-EMITTING DIODE ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Lifei Ma, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/829,764

(22) Filed: Aug. 19, 2015

(65) Prior Publication Data

US 2016/0148982 A1 May 26, 2016

Related U.S. Application Data

(63) Continuation-in-part of application No. PCT/CN2015/073122, filed on Feb. 15, 2015.

(30) Foreign Application Priority Data

Nov. 26, 2014 (CN) .......................... 2014 1 0692271

(51) Int. Cl.
*H01L 27/32* (2006.01)
*H01L 51/52* (2006.01)

(52) U.S. Cl.
CPC ........ *H01L 27/3246* (2013.01); *H01L 27/326* (2013.01); *H01L 51/5262* (2013.01)

(58) Field of Classification Search
CPC ............. H01L 27/3246; H01L 27/3258; H01L 51/5262; H01L 51/56
See application file for complete search history.

(56) References Cited

U.S. PATENT DOCUMENTS

2002/0104995 A1 8/2002 Yamazaki et al.
2002/0149320 A1* 10/2002 Maruyama ........... G09G 3/3233 315/169.3

(Continued)

FOREIGN PATENT DOCUMENTS

CN 1453883 A 11/2003
CN 1484476 A 3/2004

(Continued)

OTHER PUBLICATIONS

International Search Report Appln. No. PCT/CN2015/073122; Dated Apr. 9, 2015.

(Continued)

*Primary Examiner* — Christine Enad
(74) *Attorney, Agent, or Firm* — Ladas & Parry LLP

(57) ABSTRACT

Embodiments of the invention disclose an organic light-emitting diode array substrate and a manufacturing method thereof, and a display device. The array substrate comprises: a base substrate, a thin film transistor disposed above the base substrate, an organic light-emitting diode and a filling layer, the organic light-emitting diode including a first electrode, a second electrode, and an organic light-emitting layer disposed between the first electrode and the second electrode, wherein, in a light transmissive region of the organic light-emitting diode array substrate, the base substrate, the filling layer and the organic light-emitting layer of the organic light-emitting diode are disposed to be sequentially abutting.

14 Claims, 1 Drawing Sheet

(56) References Cited

U.S. PATENT DOCUMENTS

| | | | | |
|---|---|---|---|---|
| 2003/0201447 | A1* | 10/2003 | Yamazaki | H01L 27/3246 257/79 |
| 2004/0113545 | A1 | 6/2004 | Pang et al. | |
| 2006/0267030 | A1 | 11/2006 | Yamazaki et al. | |
| 2011/0104841 | A1 | 5/2011 | Shieh et al. | |
| 2011/0148944 | A1 | 6/2011 | Kobayashi | |
| 2011/0272675 | A1* | 11/2011 | Chung | H01L 51/5221 257/40 |
| 2012/0001184 | A1 | 1/2012 | Ha et al. | |
| 2012/0049215 | A1 | 3/2012 | Yoon et al. | |
| 2012/0169683 | A1 | 7/2012 | Hong | |
| 2013/0119389 | A1* | 5/2013 | Yamazaki | H01L 27/3246 257/59 |
| 2014/0021459 | A1* | 1/2014 | Yamazaki | H01L 27/3265 257/40 |
| 2014/0183472 | A1 | 7/2014 | Kim et al. | |
| 2015/0357384 | A1 | 12/2015 | Li et al. | |

FOREIGN PATENT DOCUMENTS

| | | | |
|---|---|---|---|
| CN | 101060130 | A | 10/2007 |
| CN | 101752400 | A | 6/2010 |
| CN | 103700692 | A | 4/2014 |
| CN | 103715222 | A | 4/2014 |
| KR | 20120079318 | A | 7/2012 |
| KR | 20140085243 | A | 7/2014 |

OTHER PUBLICATIONS

Written Opinion of the International Searching Authority Appln. No. PCT/CN2015/073122, Dated Apr. 13, 2015.

Extended European Search Report dated Apr. 12, 2016; Appl. No. 15183474.4-1555.

Korean Office Action dated Aug. 21, 2016; Appln. No. 10-2015-0136666.

First Chinese Office Action dated Sep. 5, 2016; Appln. No. 201410692271.8.

* cited by examiner

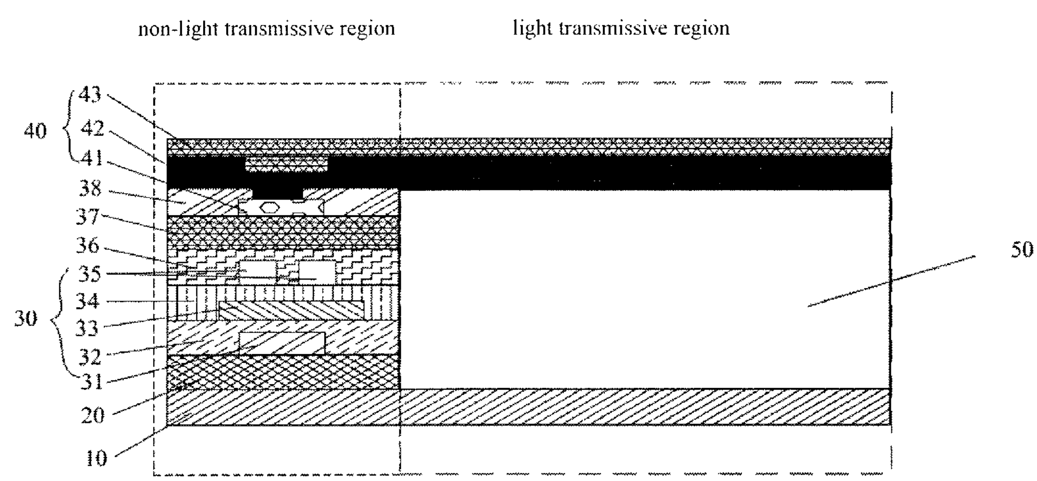
non-light transmissive region
light transmissive region
40
43
42
41
38
37
36
35
30
34
33
32
31
20
10
50

ORGANIC LIGHT-EMITTING DIODE ARRAY SUBSTRATE AND MANUFACTURING METHOD THEREOF, AND DISPLAY DEVICE

TECHNICAL FIELD

Embodiments of the invention relate to an organic light-emitting diode array substrate and a manufacturing method thereof, and a display device.

BACKGROUND

An Organic Light-Emitting Diode (OLED) is also known as an Organic Electroluminesence Display (OELD). The OLED, with self-luminous property, has a very thin organic-material coating and a glass substrate; when electrical current passes through, the organic material will emit light; moreover, an OLED display screen has a large viewing angle, and can significantly save electrical energy, so the OLED screen has many advantages unparalleled by a liquid crystal display (LCD).

Generally, light of an OLED device is always emitted from a lower substrate, that is, bottom emission. And so-called top emission refers to that light does not pass through the lower substrate, but exit from an upper side which is opposite thereto. If on the substrate, there is a highly-reflective first electrode, and a second electrode is light-transmissive, then light exit from the exterior second electrode. If the first electrode is made of a conventional light-transmissive ITO in combination with the light-transmissive second electrode, then both sides of the device will emit light.

SUMMARY

An embodiment of the invention provides an organic light-emitting diode array substrate, comprising: a base substrate, a thin film transistor disposed above the base substrate, an organic light-emitting diode and a filling layer, the organic light-emitting diode including a first electrode, a second electrode, and an organic light-emitting layer disposed between the first electrode and the second electrode, wherein, the thin film transistor is disposed in a non-light transmissive region of the organic light-emitting diode array substrate; in a light transmissive region of the organic light-emitting diode array substrate, the base substrate, the filling layer and the organic light-emitting layer of the organic light-emitting diode are disposed to be sequentially abutting.

Another embodiment of the invention provides a manufacturing method of an organic light-emitting diode array substrate, the organic light-emitting diode array substrate comprising a thin film transistor and an organic light-emitting diode, the organic light-emitting diode including a first electrode, a second electrode, and an organic light-emitting layer disposed between the first electrode and the second electrode, the method comprising:

forming a filling layer in a first region of the base substrate, the filling layer abutting the base substrate; and forming a portion of the organic light-emitting layer of the organic light-emitting diode directly on the filling layer.

A further embodiment of the invention provides a display device, comprising the above-described organic light-emitting diode array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1 is a structural schematic diagram of an organic light-emitting diode array substrate provided by an embodiment of the invention.

DETAILED DESCRIPTION

Hereinafter, the technical solutions of the embodiment of the disclosure will be described in a clearly and fully understandable way in connection with the drawing related to the embodiment of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

The applicants find that: each pixel in a light-emitting device of an active OLED is controlled by a thin film transistor, and each pixel is provided with a non-light transmissive region and a light transmissive region therein. When transmittance of the light-emitting device is tested, according to a national standard, the transmittance is defined as $$Ts = \frac{A2}{A1 + A2} \times Ts1\%,$$

where, A1 is an area of the non-light transmissive region, A2 is an area of the light transmissive region, and Ts1 is the transmittance of the light transmissive region; and thus, if Ts1 is increased, the transmittance Ts of the entire device will be increased.

In order to improve a display effect of the organic light-emitting diode array substrate, the embodiments of the invention provides an organic light-emitting diode array substrate and a manufacturing method thereof, and a display device. In the technical solutions of the embodiments of the invention, by forming a sequentially abutting structure of a base substrate, a filling layer and an organic light-emitting layer in the light transmissive region of the organic light-emitting diode array substrate, the transmissive effect of light is improved. In addition, the filling layer is made of a material having a refractive index approximate to that of the base substrate, so as to further improve the transmittance of the light in the light transmissive region, which improves the display effect of the display device.

FIG. 1 shows a cross-sectional structural schematic diagram of the organic light-emitting diode array substrate provided by an embodiment of the invention.

As shown in FIG. 1, the organic light-emitting diode array substrate provided by the embodiment of the invention includes: a base substrate 10, a thin film transistor 30 and an organic light-emitting diode 40 sequentially disposed in a stacking manner on the base substrate 10 in a direction away from the base substrate 10, wherein, the thin film transistor 30 is disposed in the non-light transmissive region of the organic light-emitting diode array substrate. The organic light-emitting diode 40 includes a first electrode 41, an organic light-emitting layer 42 and a second electrode 43 sequentially disposed in a stacking manner in the direction away from the base substrate 10. The first electrode 41 is located in the non-light transmissive region of the organic light-emitting diode array substrate and is disposed above the thin film transistor 30. The organic light-emitting layer 42 and the second electrode 43 extend to the light transmissive region of the organic light-emitting diode array substrate, and a filling layer 50 located within the light transmissive region is disposed between the organic light-emitting layer 42 and the base substrate 10, and moreover, the filling layer 50 abuts the organic light-emitting layer 42 above and abuts the base substrate 10 below. Here, the non-light transmissive region of the organic light-emitting diode array substrate refers to a region which does not allows ambient visible light to pass therethrough; correspondingly, the light transmissive region of the organic light-emitting diode array substrate refers to a region allowing ambient visible light to pass therethrough. An absolute value of a refractive index difference between the filling layer 50 and the base substrate 10 is within a preset range. The thin film transistor 30 and the first electrode 41 are formed to be stacked on a same side of the filling layer 50, and a sum of thicknesses of the thin film transistor 30 and the first electrode 41 is no more than a thickness of the filling layer 50. In an example, the filling layer 50 is adjacent to the thin film transistor 30 and the first electrode 41. In the above technical solution, the thin film transistor 30 is disposed in the non-light transmissive region of the organic light-emitting diode array substrate, and only the filling layer 50, the organic light-emitting layer 42 and the second electrode 43 are disposed in the light transmissive region, which reduces the number of types of medium through which the light passes during transmission, and further improves the transmissive effect of the light. In addition, use of the filling layer 50 having a refractive index approximate to that of the base substrate 10 further improves the transmittance of the light, so as to improve the display effect of the display device.

The organic light-emitting diode array substrates provided by the embodiments of the invention can be used for transparent display, such as for a display window, etc. In the organic light-emitting diode array substrate provided by the embodiment of the present invention, the non-light transmissive region can be used for displaying image by the organic light-emitting diode, and the light transmissive region can be used for transmission of ambient visible light, so that the viewer can see an object located at a rear side of the organic light-emitting diode array substrate (i.e., a side opposite to the viewer). Thus, the viewer can see the image displayed by the organic light emitting diode array substrate, and can see the object at the rear of the organic light emitting diode array substrate.

The array substrate in the above-described embodiment further includes a pixel defining layer 38 disposed between the thin film transistor 30 and the organic light-emitting layer 42. According to design requirements on the organic light-emitting diode array substrate, the first electrode 41 and the second electrode 43 are a cathode and an anode respectively, or the first electrode 41 and the second electrode 43 are an anode and a cathode respectively. For example, the first electrode 41 is an anode, and correspondingly the second electrode 43 is a cathode; or the first electrode 41 is a cathode, and correspondingly the second electrode 43 is an anode. All or part of the light emitted from the organic light-emitting layer 42 of the organic light-emitting diode 40 exits upward. In the above-described embodiment, the thin film transistor 30 and the first electrode 41 of the organic light-emitting diode 40 are provided in the non-light transmissive region of the organic light-emitting diode array substrate to display image; there are only the filling layer 50, the organic light-emitting layer 42 and the second electrode 43 in the light transmissive region in the organic light-emitting diode array substrate, thus reducing the number of types of the medium through which the light passes and improving the transmissive effect of the light. In addition, the absolute value of the refractive index difference between the filling layer 50 and the base substrate 10 is within a preset range, so that a refractive index of the filling layer 50 is approximately equal to a refractive index of the base substrate 10, which reduces reflection of the light on a contact surface between the filling layer 50 and the base substrate 10, and ensures more light refracted on the contact surface, so that more light can exit, which further improves the display effect of the display device.

Therein, the base substrate 10 can be a substrate made of a common transparent material such as glass, quartz, sapphire, and resin.

As can be seen from the above description, the structure of the display device provided by this embodiment reduces the number of types of the medium through which the light passes during transmission, and improves the transmissive effect of the light. In addition, use of the filling layer 50 having the refractive index approximate to that of the base substrate 10 further improves the transmittance of the light, so as to improve the display effect of the display device.

The preset range of the absolute value of the refractive index difference between the filling layer 50 and the base substrate 10 is 0-0.3. For example, when the base substrate 10 is a glass substrate, a refractive index of the glass substrate is 1.5, and therefore, the refractive index of the filling layer 50 is within 1.2-1.8, and the refractive index thereof can be any value within 1.2-1.8, for example, 1.2, 1.3, 1.4, 1.45, 1.5, 1.55, 1.6, 1.7 or 1.8, etc.

The filling layer 50 that meets the above-described preset range can be made of different materials. For example, when the base substrate 10 is a glass substrate, the filling layer 50 can be any one of propenyl diglycol carbonate, polymethylmethacrylate or polycarbonate. Therein, propenyl diglycol carbonate is briefly referred to as CR-39, whose physical properties include: a refractive index of 1.498 and a transmittance of 92%. Organic glass is briefly referred to as PMMA, i.e., polymethyl methacrylate, whose physical properties include: a refractive index of 1.49 and a transmittance of 92%. Polycarbonate, is briefly referred to as PC, whose physical properties include: a refractive index 1.585 and a transmittance of 90%. The refractive indexes of the above-described several materials are approximate to the refractive index of the base substrate 10, so as to ensure that more light can exit from the light transmissive region, which improves the display effect of the display device.

For example, the thin film transistor can include an active layer 31, a gate insulating layer 32 disposed on the active layer 31, a gate electrode 33 disposed on the gate insulating layer 32, an intermediate insulating layer 34 disposed on the gate electrode 33, a source electrode and a drain electrode 35 disposed on the intermediate insulating layer 34, as shown in FIG. 1. It should be understood that the thin film transistor 30 in the above-described embodiment can also be of different structures. As can be seen from FIG. 1, the thin film transistor 30 is totally disposed in the non-light transmissive region of the display device, while in the light transmissive region, there is only the filling layer 50 between the light-emitting organic light-emitting layer 42 and the base substrate 10. As compared with the prior art, the organic light-emitting diode array substrate provided by the embodiment of the present application can reduce the number of types of the medium through which the light passes, before exiting the array substrate, improve the transmittance of the light, and further improve the display effect of the display device.

In addition, in order to improve safety of the entire device, the organic light-emitting diode array substrate further comprises a buffer layer 20 disposed between the base substrate 10 and the thin film transistor 30.

Meanwhile, the organic light-emitting diode array substrate further comprises a passivation layer 36 and a planarization layer 37 disposed between the source electrode as well as the drain electrode 35 and the pixel defining layer 38. The planarization layer 37 facilitates formation of the pixel defining layer 38 during fabrication.

Although in the above-described embodiment, the thin film transistor 30 is disposed between the organic light-emitting diode 40 and the base substrate 10, it should be understood that in another embodiment, the organic light-emitting diode 40 can be disposed between the thin film transistor 30 and the base substrate 10.

An embodiment of the invention further provides a manufacturing method of the above-described organic light-emitting diode array substrate. The method comprises steps of:

Forming a filling layer in a first region of the base substrate, and an absolute value of a refractive index difference between the filling layer and the base substrate being within a preset range;

Forming a thin film transistor in a second region of the base substrate;

Forming an organic light-emitting diode on the thin film transistor and the filling layer, wherein, the organic light-emitting diode includes a first electrode, an organic light-emitting layer and a second electrode sequentially disposed in a stacking manner in a direction away from the base substrate, the first electrode is located in the second region of the base substrate and is disposed above the thin film transistor, and the organic light-emitting layer and the second electrode extend to the first region of the base substrate. Here, the first region and the second region of the base substrate respectively correspond to a light transmissive region and a non-light transmissive region of the organic light-emitting diode array substrate.

In the above-described manufacturing method, the thin film transistor is disposed in the non-light transmissive region of the organic light-emitting diode array substrate, and only the filling layer, the organic light-emitting layer and the second electrode are disposed in the light transmissive region, which reduces the number of types of medium through which the light passes during travelling in the light transmissive region of the array substrate, and improves the transmittance of the light. In addition, use of the filling layer having a refractive index approximate to that of the base substrate further improves the transmittance of the light and further improves the display effect of the display device.

Before the forming an organic light-emitting diode on the thin film transistor, the method can further comprise forming a passivation layer and a planarization layer on the thin film transistor.

In an embodiment, the manufacturing method of the above-described organic light-emitting diode array substrate comprises:

Step One: forming a buffer layer in a region of the base substrate corresponding to a non-light transmissive region of the organic light-emitting diode array substrate;

Step Two: forming an active layer on the buffer layer;

Step Three: forming a gate insulating layer on the active layer;

Step Four: forming a gate electrode on the gate insulating layer;

Step Five: forming an intermediate insulating layer on the gate electrode;

Step Six: forming a source electrode and a drain electrode on the intermediate insulating layer;

Step Seven: sequentially forming a passivation layer and a planarization layer stacked on the source electrode and the drain electrode;

Step Eight: forming a first electrode on the planarization layer;

Step Nine: forming a pixel defining layer on the first electrode;

Step Ten: forming a filling layer in a region of the base substrate corresponding to a light transmissive region of the organic light-emitting diode array substrate;

Step Eleven: forming an organic light-emitting layer on the pixel defining layer and the filling layer;

Step Twelve: forming a second electrode on the organic light-emitting layer.

Furthermore, an embodiment of the invention further provides a display device comprising any of the above-described organic light-emitting diode array substrates, which can be used for transparent display. The display device can be an OLED panel, a mobile phone, a tablet personal computer, a television, a monitor, a laptop, a digital photo frame, a navigator, and any other product or component having a display function.

In the above-described embodiments, the thin film transistor is disposed in the non-light transmissive region of the organic light-emitting diode array substrate, and only the filling layer, the organic light-emitting layer and the second electrode are disposed in the light transmissive region, which reduces the number of types of medium through which the light passes during transmission, and meanwhile, the use of the filling layer having the refractive index approximate to that of the base substrate further improves the transmittance of the light so as to improve the display effect of the display device.

According to the above description, the structures and the methods can be provided at least as follows according to the embodiments of the invention:

(1) An organic light-emitting diode array substrate, comprising: a base substrate, a thin film transistor disposed above the base substrate, an organic light-emitting diode and a filling layer, the organic light-emitting diode including a first electrode, a second electrode, and an organic light-emitting layer disposed between the first electrode and the second electrode, wherein, the thin film transistor is disposed in a non-light transmissive region of the organic light-emitting diode array substrate; in a light transmissive region of the organic light-emitting diode array substrate, the base substrate, the filling layer and the organic light-emitting layer of the organic light-emitting diode are disposed to be sequentially abutting.

(2) The organic light-emitting diode array substrate according to (1), wherein, an absolute value of a refractive index difference between the filling layer and the base substrate is within a preset range.

(3) The organic light-emitting diode array substrate according to (1) or (2), wherein, the first electrode of the organic light-emitting diode is located in the non-light transmissive region of the organic light-emitting diode array substrate and above the thin film transistor, and the organic light-emitting layer and the second electrode of the organic light-emitting diode are disposed in the light transmissive region and the non-light transmissive region.

(4) The organic light-emitting diode array substrate according to any one of (1) to (3), wherein, the preset range is 0-0.3.

(5) The organic light-emitting diode array substrate according to any one of (1) to (4), wherein, the base substrate is a glass substrate, and the filling layer is any one of propenyl diglycol carbonate, polymethylmethacrylate or polycarbonate.

(6) The organic light-emitting diode array substrate according to any one of (1) to (5), further comprising a pixel defining layer disposed between the thin film transistor and the organic light-emitting layer.

(7) The organic light-emitting diode array substrate according to any one of (1) to (6), wherein, the thin film transistor includes an active layer, a gate insulating layer disposed on the active layer, a gate electrode disposed on the gate insulating layer, an intermediate insulating layer disposed on the gate electrode, and a source electrode and a drain electrode disposed on the intermediate insulating layer.

(8) The organic light-emitting diode array substrate according to (6) or (7), further comprising a passivation layer and a planarization layer disposed between the source electrode as well as the drain electrode and the pixel defining layer.

(9) The organic light-emitting diode array substrate according to any one of (1) to (8), further comprising a buffer layer disposed between the base substrate and the thin film transistor.

(10) A manufacturing method of an organic light-emitting diode array substrate, the organic light-emitting diode array substrate comprising a thin film transistor and an organic light-emitting diode, the organic light-emitting diode including a first electrode, a second electrode, and an organic light-emitting layer disposed between the first electrode and the second electrode, the method comprising:

forming a filling layer in a first region of the base substrate, the filling layer abutting the base substrate; and forming a portion of the organic light-emitting layer of the organic light-emitting diode directly on the filling layer.

(11) The manufacturing method of the organic light-emitting diode array substrate according to (10), wherein, an absolute value of a refractive index difference between the filling layer and the base substrate is within a preset range.

(12) The manufacturing method of the organic light-emitting diode array substrate according to (10) or (11), further comprising:

forming the thin film transistor in a second region different from the first region of the base substrate;

forming the first electrode of the organic light-emitting diode above the thin film transistor;

forming at least a portion of the organic light-emitting layer of the organic light-emitting diode and the second electrode on the first electrode of the organic light-emitting diode and the filling layer.

(13) The manufacturing method of the organic light-emitting diode array substrate according to (12), further comprising: before the forming the first electrode of the organic light-emitting diode above the thin film transistor, forming a passivation layer and a planarization layer on the thin film transistor.

(14) The manufacturing method of the organic light-emitting diode array substrate according to any one of (10) to (13), wherein, the first region and the second region of the base substrate respectively correspond to a light transmissive region and a non-light transmissive region of the organic light-emitting diode array substrate.

(15) A display device, comprising the organic light-emitting diode array substrate according to any one of (1) to (9).

Although the disclosure is illustrated in detail by general description and specific embodiments above, certain amendments and improvements can be made based on the disclosure, which is obvious for those skilled in the art. Therefore, the amendments or improvements made on the present disclosure without departing from the spirit of the present disclosure should be within the scope of the present disclosure.

The present application claims priority of Chinese Patent Application No. 201410692271.8 filed on Nov. 26, 2014, the disclosure of which is incorporated herein by reference in its entirety as part of the present application.

What is claimed is:

1. An organic light-emitting diode array substrate, comprising: a base substrate, a thin film transistor disposed above the base substrate, an organic light-emitting diode and a filling layer, the organic light-emitting diode including a first electrode, a second electrode, and an organic light-emitting layer disposed between the first electrode and the second electrode, wherein, the thin film transistor is disposed in a non-light transmissive region of the organic light-emitting diode array substrate; in a light transmissive region of the organic light-emitting diode array substrate, the base substrate, the filling layer and the organic light-emitting layer of the organic light-emitting diode are disposed to be sequentially abutting, the non-light transmissive region of the organic light-emitting diode array substrate is a region which does not allows ambient visible light to pass therethrough; and the light transmissive region of the organic light-emitting diode array substrate is a region allowing ambient visible light to pass therethrough, wherein, in the light transmissive region, the filling layer is in direct contact with the base substrate, and the organic light-emitting layer is in direct contact with the filling layer.

2. The organic light-emitting diode array substrate according to claim 1, wherein, an absolute value of a refractive index difference between the filling layer and the base substrate is within a preset range, the preset range is 0-0.3.

3. The organic light-emitting diode array substrate according to claim 1, wherein, the first electrode of the organic light-emitting diode is located in the non-light transmissive region of the organic light-emitting diode array substrate and above the thin film transistor, and the organic light-emitting layer and the second electrode of the organic light-emitting diode are disposed in the light transmissive region and the non-light transmissive region.

4. The organic light-emitting diode array substrate according to claim 1, wherein, the base substrate is a glass substrate, and the filling layer is any one of propenyl diglycol carbonate, polymethylmethacrylate or polycarbonate.

5. The organic light-emitting diode array substrate according to claim 1, further comprising a pixel defining layer disposed between the thin film transistor and the organic light-emitting layer.

6. The organic light-emitting diode array substrate according to claim 5, wherein, the thin film transistor includes an active layer, a gate insulating layer disposed on the active layer, a gate electrode disposed on the gate insulating layer, an intermediate insulating layer disposed on the gate electrode, and a source electrode and a drain electrode disposed on the intermediate insulating layer.

7. The organic light-emitting diode array substrate according to claim 6, further comprising a passivation layer and a planarization layer disposed between the source electrode as well as the drain electrode and the pixel defining layer.

8. The organic light-emitting diode array substrate according to claim 1, further comprising a buffer layer disposed between the base substrate and the thin film transistor.

9. A display device, comprising the organic light-emitting diode array substrate according to claim 1.

10. A manufacturing method of an organic light-emitting diode array substrate, the organic light-emitting diode array substrate comprising a thin film transistor and an organic light-emitting diode, the organic light-emitting diode including a first electrode, a second electrode, and an organic light-emitting layer disposed between the first electrode and the second electrode, the method comprising:

forming a filling layer in a first region of the base substrate, the filling layer abutting the base substrate; and forming a portion of the organic light-emitting layer of the organic light-emitting diode directly on the filling layer, wherein, the thin film transistor is disposed in a non-light transmissive region of the organic light-emitting diode array substrate; in a light transmissive region of the organic light-emitting diode array substrate, the base substrate, the filling layer and the organic light-emitting layer of the organic light-emitting diode are disposed to be sequentially abutting, the non-light transmissive region of the organic light-emitting diode array substrate is a region which does not allows ambient visible light to pass therethrough; and the light transmissive region of the organic light-emitting diode array substrate is a region allowing ambient visible light to pass therethrough, wherein, in the light transmissive region, the filling layer is in direct contact with the base substrate, and the organic light-emitting layer is in direct contact with the filling layer.

11. The manufacturing method of the organic light-emitting diode array substrate according to claim 10, wherein, an absolute value of a refractive index difference between the filling layer and the base substrate is within a preset range, the preset range is 0-0.3.

12. The manufacturing method of the organic light-emitting diode array substrate according to claim 10, further comprising:

forming the thin film transistor in a second region different from the first region of the base substrate;

forming the first electrode of the organic light-emitting diode above the thin film transistor;

forming at least a portion of the organic light-emitting layer of the organic light-emitting diode and the second electrode on the first electrode of the organic light-emitting diode and the filling layer.

13. The manufacturing method of the organic light-emitting diode array substrate according to claim 12, further comprising: before the forming the first electrode of the organic light-emitting diode above the thin film transistor, forming a passivation layer and a planarization layer on the thin film transistor.

14. The manufacturing method of the organic light-emitting diode array substrate according to claim 10, wherein, the first region and the second region of the base substrate respectively correspond to a light transmissive region and a non-light transmissive region of the organic light-emitting diode array substrate.

* * * * *